(12) United States Patent
Lee et al.

(10) Patent No.: US 11,503,734 B2
(45) Date of Patent: Nov. 15, 2022

(54) ASSEMBLY FOR CARD EXPANSION ON PRINTER CIRCUIT BOARD

(71) Applicant: Dell Products L.P., Round Rock, TX (US)

(72) Inventors: Chih Huang Lee, Hsinchu (TW); Chi-Ming Sun, Taoyuan (TW); Yu Ming Kuo, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 126 days.

(21) Appl. No.: 17/184,638

(22) Filed: Feb. 25, 2021

(65) Prior Publication Data
US 2022/0272858 A1    Aug. 25, 2022

(51) Int. Cl.
*H05K 7/14*    (2006.01)
*G06F 1/18*    (2006.01)

(52) U.S. Cl.
CPC ........... *H05K 7/1429* (2013.01); *G06F 1/185* (2013.01); *G06F 1/186* (2013.01); *H05K 7/1408* (2013.01)

(58) Field of Classification Search
CPC .......... G06F 1/186; G06F 1/185; G06F 1/182; H05K 7/1409; H05K 7/1429; H05K 7/1408; H05K 7/1461; H01R 13/648; H01R 13/6581; H01R 13/6594; H01R 13/6596
See application file for complete search history.

(56) References Cited

U.S. PATENT DOCUMENTS 6,278,610 B1 * 8/2001 Yasufuku ............... H01R 12/88
361/755
10,631,445 B2 * 4/2020 Chang .................. H05K 9/0024

* cited by examiner

*Primary Examiner* — James Wu
(74) *Attorney, Agent, or Firm* — Terrile, Cannatti & Chambers, LLP; Emmanuel A. Rivera

(57) ABSTRACT

An expansion card holder assembly that accepts different size expansion cards is disclosed. The expansion card holder assembly includes a metal base with grooves that roller features of a metal slide bracket fit into. The metal slide bracket is positioned along the metal base for different size expansion cards. The metal slide bracket is connected with a metal cover that is opened to accept expansions cards. A connector is provided for the expansion card to connect with printed circuit board.

19 Claims, 9 Drawing Sheets

ASSEMBLY FOR CARD EXPANSION ON PRINTER CIRCUIT BOARD

BACKGROUND OF THE INVENTION

Field of the Invention

The present invention relates to information handling systems and devices. More specifically, embodiments of the invention relate to card expansion on printed circuit board assemblies of information handling systems.

Description of the Related Art

Information handling systems, such as desktop computers, typically have expandable printed circuit board assemblies that allow for adding or expanding for functional cards or expansion cards. M.2, also known as Next Generation Form Factor (NGFF) is a standard for such expansion cards. Expansion cards can provide various functions. Examples of such functions include expanded memory/storage, communications such as WiFi, graphics, etc. And depending on the function that an expansion card provides, certain electrical and/or thermal properties may be needed. For example, proper grounding of an expansion card may be needed. Certain expansion cards may need thermal shielding. Also, in certain instances, electro-magnetic interference or radio interference shielding may also be desired.

The size of expansion cards can also vary. The M.2 standard provides for different card sizes; however, certain implementations may require different size cards to be installed on a printed circuit board assembly. Therefore, when adding expansion cards, size of the expansion card is considered, as well as providing proper environmental conditions, such as electrical grounding, thermal shielding, and electro-magnetic interference or radio interference shielding.

A printed circuit board assembly has limited horizontal real estate. In other words, there is limited space to add expansion cards on the surface of a printed circuit board assembly. If a user desires to add multiple expansion cards, the size of the printed circuity board assembly restricts the number of expansion cards that can be added. In certain implementations, expansion cards may be added using pre-designed interface slots, such as PCI Express (Peripheral Component Interconnect Express); however, such solutions require the card to be installed on a connectivity card on "tool" such as a PCI express card. Furthermore, the interface slots have to be predesigned to support the printed circuit board assembly.

SUMMARY OF THE INVENTION

An expansion card holder assembly that accepts different size expansion cards is disclosed. The expansion card holder assembly includes a metal base with grooves that roller features of a metal slide bracket fit into. The metal slide bracket is positioned along the metal base for different size expansion cards. The metal slide bracket is connected with a metal cover that is opened to accept expansions cards. A connector is provided for the expansion card to connect with printed circuit board.

BRIEF DESCRIPTION OF THE DRAWINGS

The use of the same reference number throughout the several figures designates a like or similar element. The present invention may be better understood, and its numerous objects, features, and advantages made apparent to those skilled in the art by referencing the accompanying drawings, wherein.

DETAILED DESCRIPTION

In various embodiments, an expansion card holder assembly is provided for various sized computer expansion cards, such as M.2 cards. For certain implementations, the expansion card holder assembly is mounted vertically on a printed circuit board assembly (PCBA). In certain implementations, the expansion card holder assembly horizontal, or on the horizontal surface of the PCBA.

Embodiments provide for the expansion card holder assembly to include a metal base, metal cover, metal slide bracket, and an expansion card connector. The expansion card holder assembly is configured to receive or house various size standardized expansion cards, and provide for electrical grounding, thermal shielding, and electro-magnetic interference or radio interference shielding. In particular, in instances where a WiFi or other radio transmission expansion device, electro-magnetic compatibility (EMC) is desired to prevent electron-magnetic interference or radio interference between the expansion card and other internal components of the information handling system that includes the PCBA.

Figure 1:
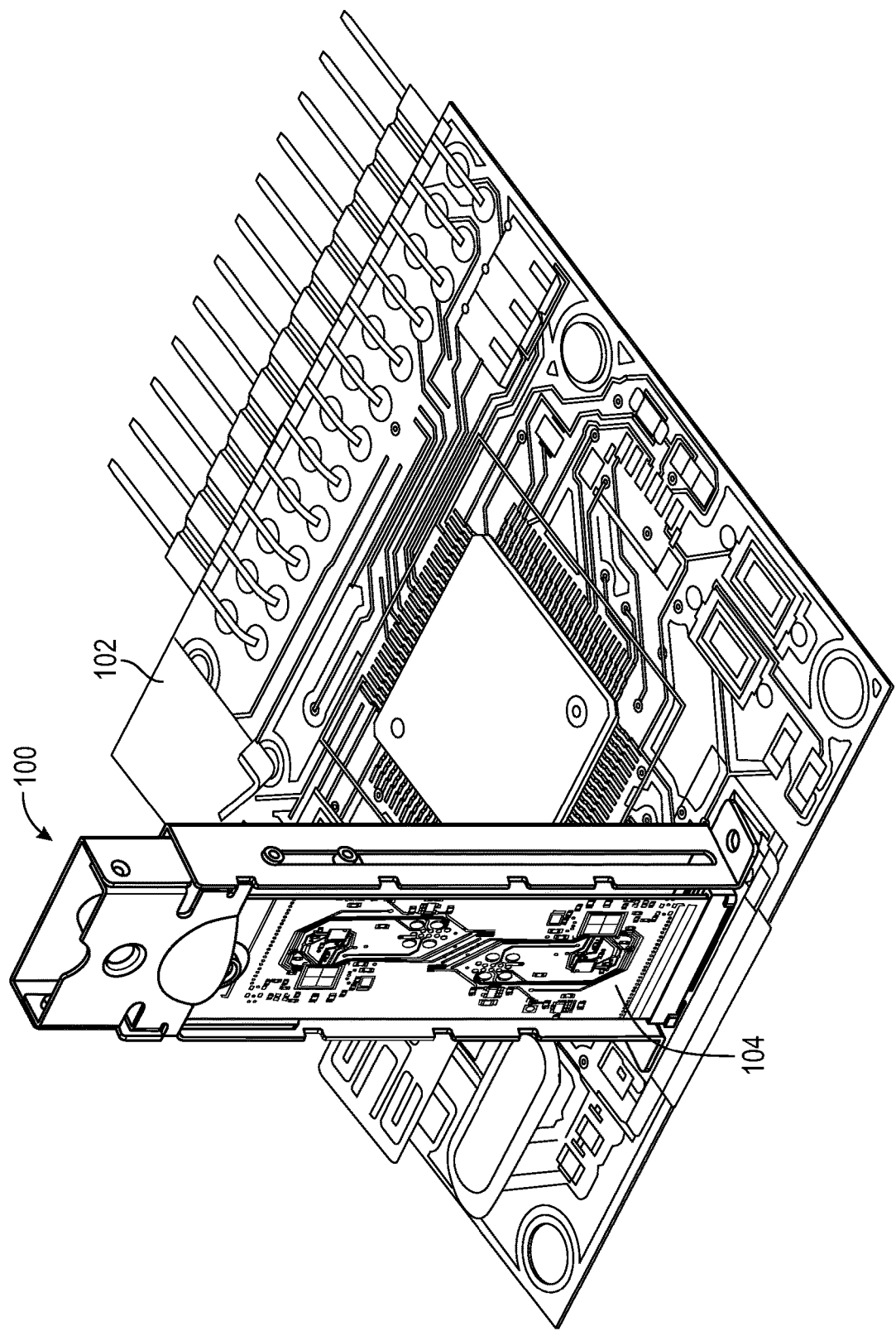
FIG. 1 depicts a top, front and right perspective view of an expansion card holder assembly vertically mounted on a printed circuit board assembly.

FIG. 1 illustrates a top, front and right perspective view of an expansion card holder assembly vertically placed on a PCBA. The expansion card holder assembly 100 is placed vertically on PCBA 102. The PCBA 102 may be part of an information handling system, such as a desktop computer. PCBA 102 has a defined horizontal surface area, and in certain implementations is unable to accommodate horizontally placed expansion cards. Vertical mounting of the expansion cards provides for a greater number of cards to be added to the PCBA 102, than horizontal mounting. Various implementations provide for predetermined interface connections for expansion card 104. The expansion card 104 can provide specific functionality, such as expanded memory/storage, communications such as WiFi, graphics, etc. In various embodiments, the expansion card 104 is based on the M.2 standard, and the expansion card holder assembly 100 is configured to support the M.2 standard.

Figure 2:
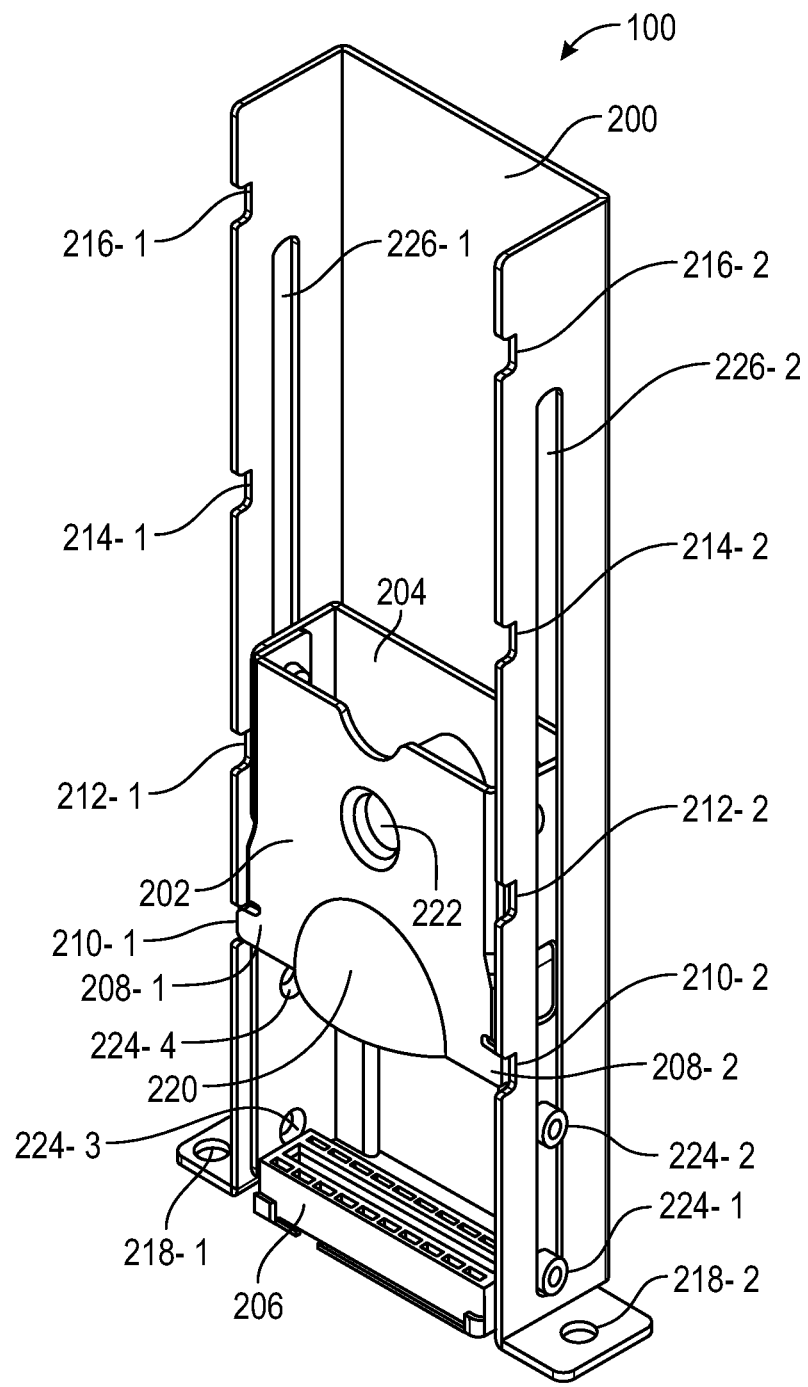
FIG. 2 depicts a top, front and right perspective view of a vertically mounted expansion card holder assembly.

FIG. 2 illustrates a top, front and right perspective view of a vertically mounted expansion card holder assembly. The vertically mounted expansion card holder assembly 100 includes a metal base 200, a metal cover 202, and a metal slide bracket 204. An expansion card connector 206 is also provided in expansion card holder assembly 100. The expansion card connector 206 can further provide for antenna connections for wireless communication expansion cards, such as WiFi cards.

Embodiments provide for stopper tabs 208-1 and 208-2 to be included in metal cover 202. The metal base 200 includes one or more stopper indents to accept stopper indents. In certain implementations, the stopper indents are placed to support certain standardized expansion cards. In this example, for the M.2 standard, stopper indents 210-1 and 210-2 support 2230 M.2 cards; stopper indents 212-1 and 212-2 support 2242 M.2 cards; stopper indents 214-1 and 214-2 support 2260 M.2 cards; and stopper indents 216-1 and 216-2 support 2280 M.2 cards.

Metal base 200 includes attachment points, represented by screw holes 218-1 and 218-2, which provide for the expansion card holder assembly 100 to be mounted onto the PCBA 102. As further discussed herein, a standoff of the metal slide bracket 204 accepts a module or expansion card 104. Along with mounting screws of screw holes 218-1 and 218-2, the standoff can provide an electrical ground path through metal base 200 to PCBA 102.

The metal cover 202 has a thickness with an elastic function allow off and on. A tab 220 is provided for a user to lift the metal cover off and on. Metal cover 202 further includes a standoff component 222 that couples with module standoff further described herein.

In various implementations, the metal slide bracket 204 includes roller type features 224-1, 224-2, 224-3 and 224-4. The roller type features 224 fit in grooves 226-1 and 226 of the metal base 200 to secure and allow the metal slide bracket 204 and cover 202 to move along the metal base 200.

Figure 3:
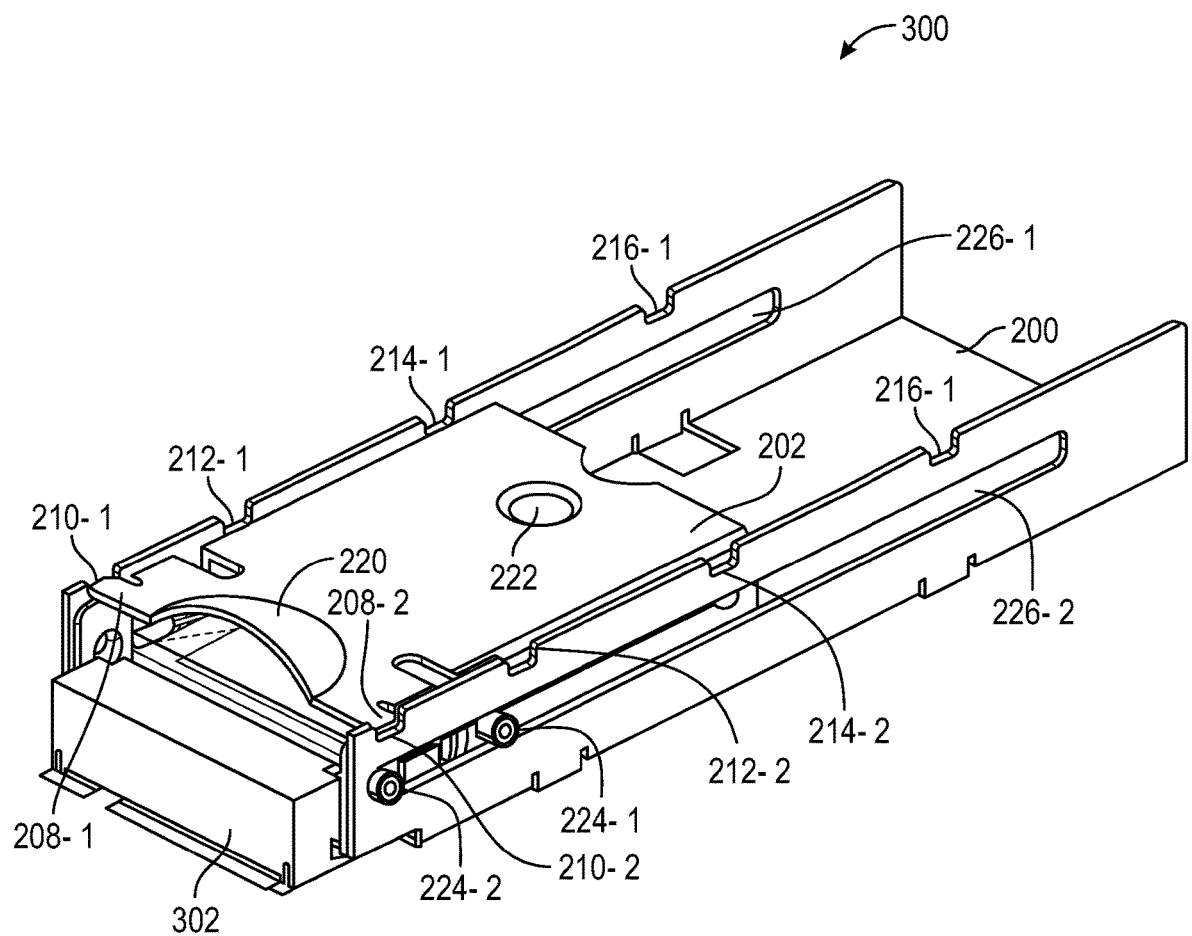
FIG. 3 depicts a top, front and right perspective view of a horizontally mounted expansion card holder assembly.

FIG. 3 illustrates a top, front and right perspective view of a horizontally mounted expansion card holder assembly. In certain implementations, it may be desirable to provide for a horizontally mounted expansion card holder assembly 300. In such implementations, the horizontally mounted expansion card holder assembly 300 can include a mounting assembly 302 that is secured to the PCBA 102. The mounting assembly 320 can include the expansion card connector 206 described in FIG. 2. Other elements as described in FIG. 2 can be provided in the horizontally mounted expansion card holder assembly 300.

Figure 4:
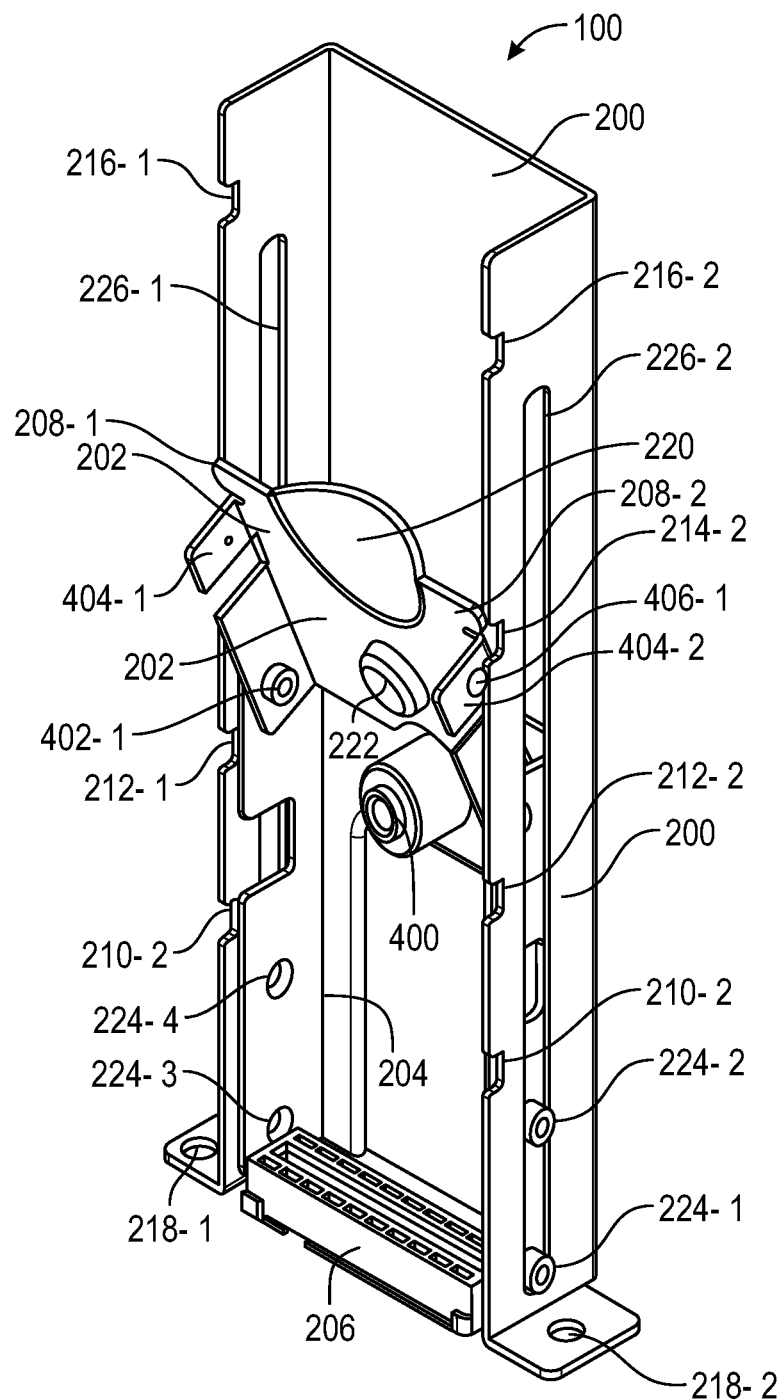
FIG. 4 depicts a top, front and right perspective view of a vertically mounted expansion card holder assembly with a cover opened.

FIG. 4 illustrates a top, front and right perspective view of a vertically mounted expansion card holder assembly 100 with metal cover 202 opened. The metal slide bracket 204 includes a standoff 400. The standoff 400, along with screws of mounting screw holes 218-1 and 218-2 can provide an electrical ground path for a module or expansion card 104. Standoff 400 is connected directly to the ground plane on a platform (i.e., metal slide bracket 204 and metal base 200). Therefore, when the module or expansion card 104 is inserted into the vertically mounted expansion card holder assembly 100, with metal screws in place in screw holes 218-1 and 218-2, an electrical ground connection can be made. Furthermore, the standoff 400 can provide for a thermal ground path, and especially when implemented with a thermal pad as described below. Similarly, such an implementation can be provided for horizontally mounted expansion card holder assembly 300.

FIG. 4 further shows insert pins 402-1 and 402-2 of metal slide bracket 404. The insert pins 402-1 and 402-2 connect the metal cover 202 to the metal slide bracket 204 and allow the metal cover 202 to pivot open and close. Metal slide bracket 204 further can include lock tabs 404-1 and 404-2. Each lock tab 404 can include a lock point 406, such as 406-1 of lock tab 404-2. In certain implementations, holes or indents (not shown) can be included in metal slide bracket 204 which accept the lock points 406.

Figure 5:
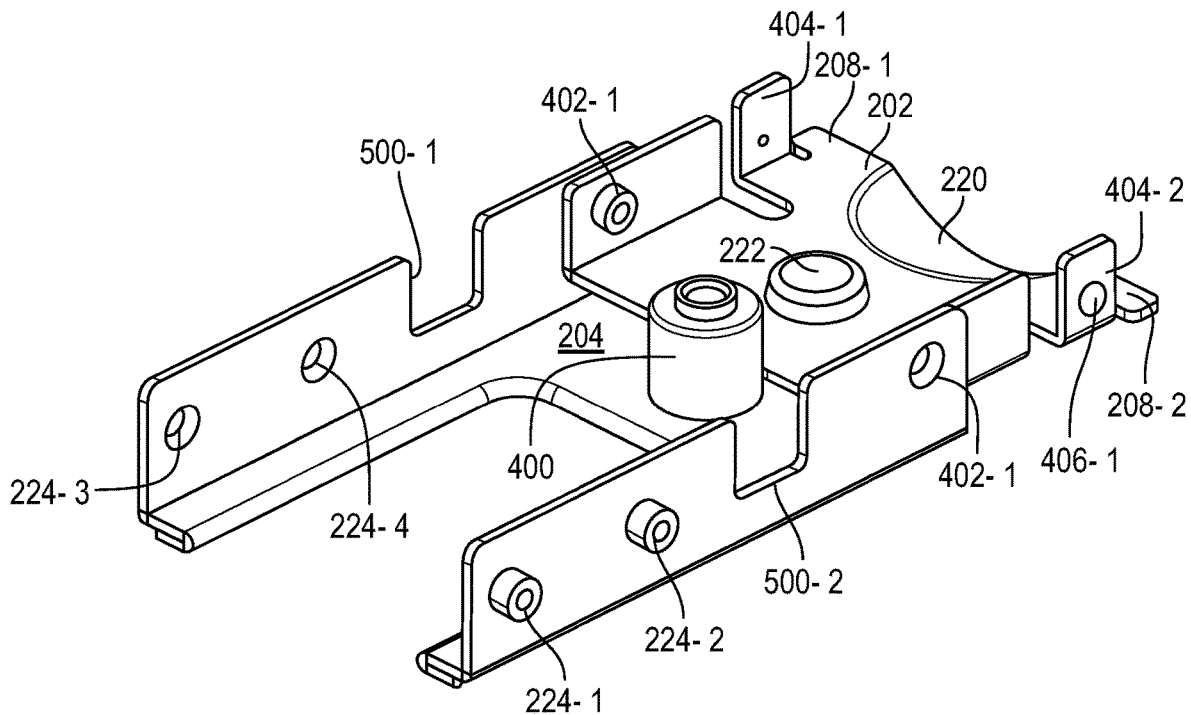
FIG. 5 depicts a top, front and right perspective view of an open metal cover connected to a metal slide bracket.

FIG. 5 illustrates a top, front and right perspective view of open metal cover 202 connected to metal slide bracket 204. The metal slide bracket 204 includes the standoff 400 which is coupled to the standoff component 222 of metal cover 202. The metal slide bracket 204 includes lock tab insert openings 500-1 and 500-2 that accept the lock tabs 404-1 and 404-2, when metal cover 202 is closed onto the metal slide bracket 204.

Figure 6:
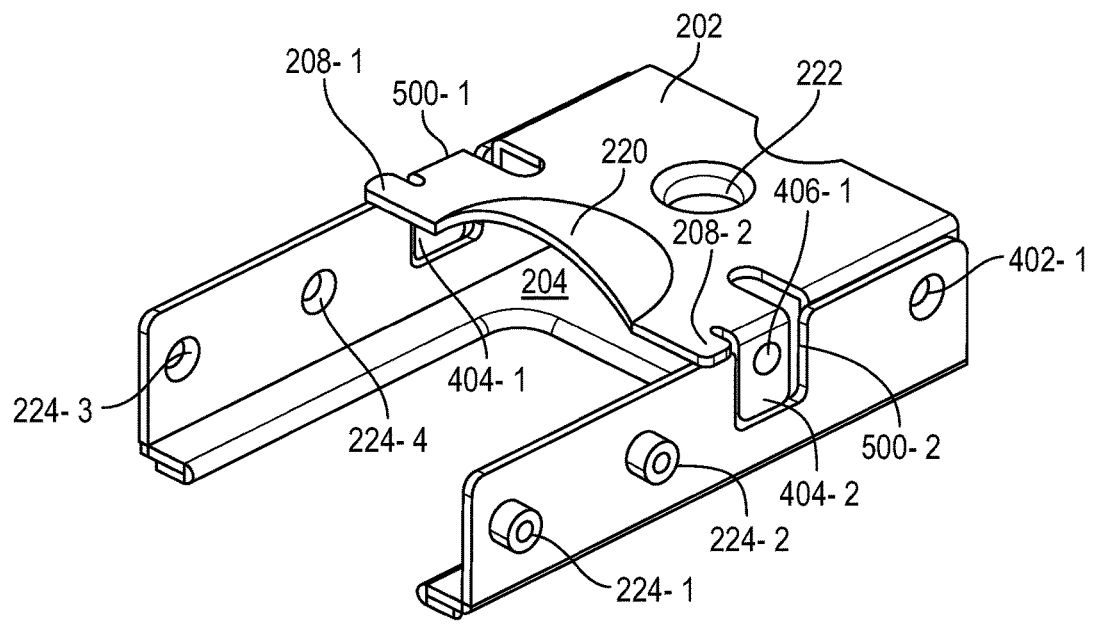
FIG. 6 depicts a top, front and right perspective view of a closed metal cover connected to a metal slide bracket.

FIG. 6 illustrates a top, front and right perspective view of closed metal cover 202 connected to metal slide bracket 204. The metal cover 202 pivots and closes onto the metal slide bracket 204 to secure expansion card 104. The lock tabs 404-1 and 404-2 of the metal cover are secured into the lock tab insert openings 500-1 and 500-2 of metal slide bracket 204.

Figure 7:
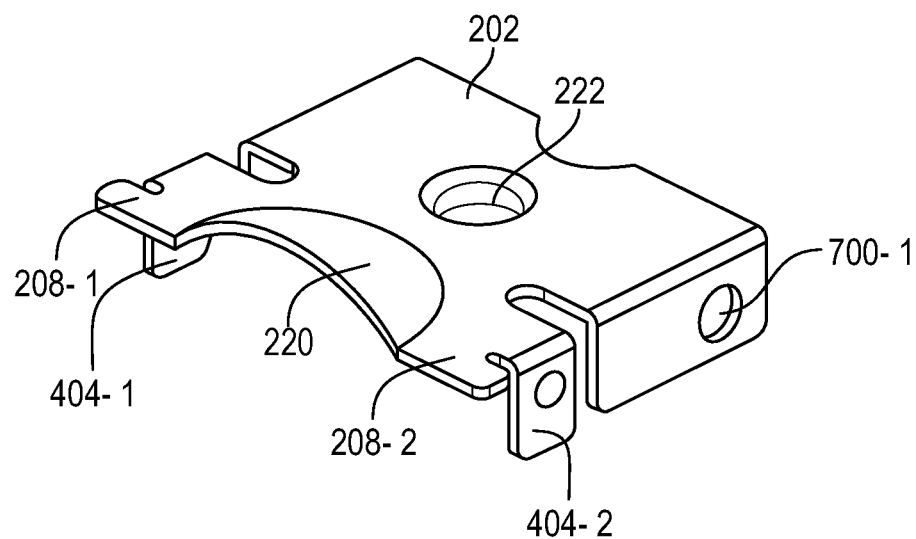
FIG. 7 depicts a top, front and right perspective view of a metal cover.

FIG. 7 illustrates a top, front and right perspective view of metal cover 202. FIG. 7 further shows an opening 700-1 of metal cover 202 that accepts insert pin 402-1 of metal slide bracket 204. Likewise, an opening 700-2 (not shown) of metal cover 204 accepts the inset pin 402-2 of metal slide bracket 204.

Figure 8:
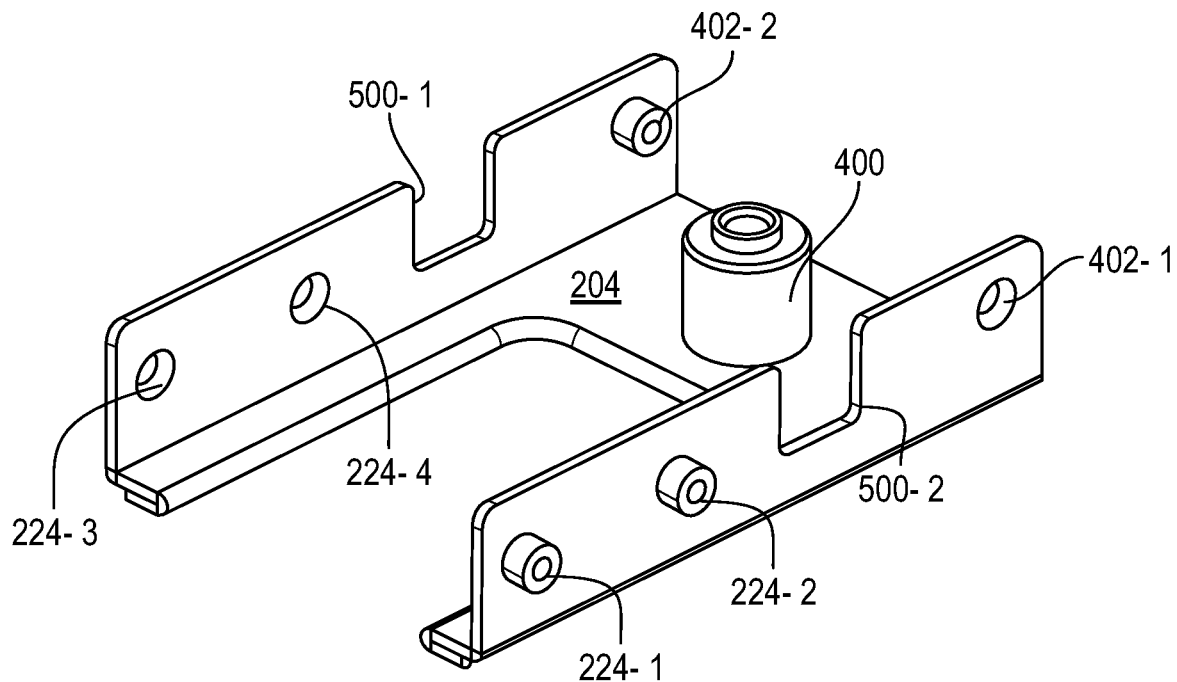
FIG. 8 depicts a top, front and right perspective view of a metal slide bracket.

FIG. 8 illustrates a top, front and right perspective view of metal slide bracket 204.

Figure 9:
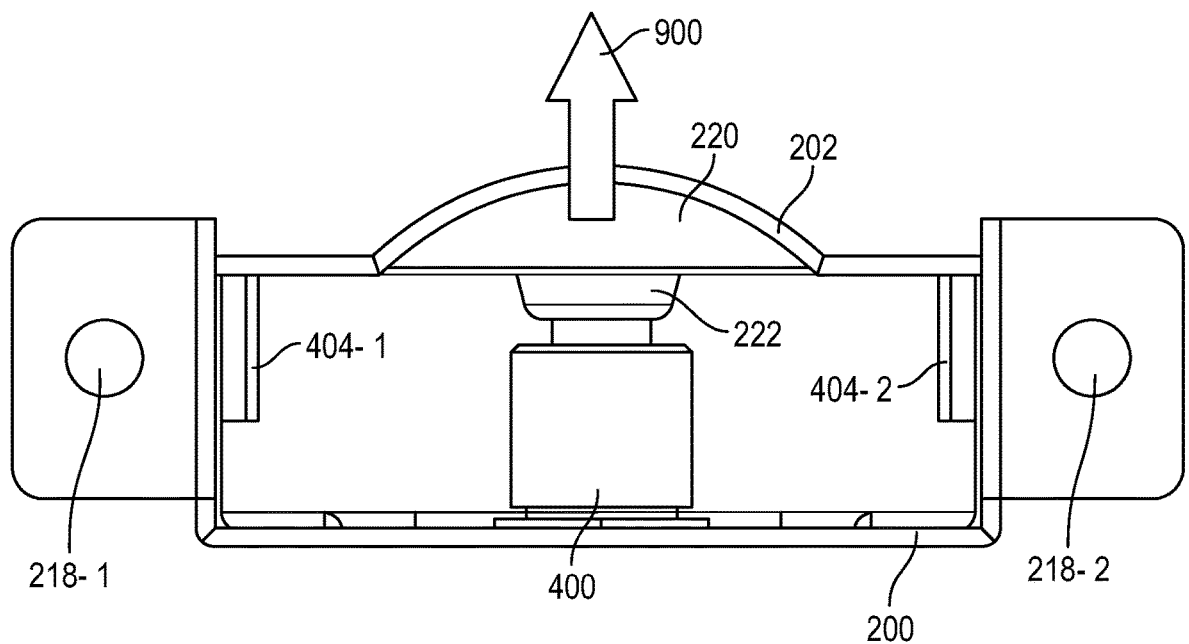
FIG. 9 depicts a bottom view of a closed metal cover on a metal slide bracket.

FIG. 9 illustrates a bottom perspective view of expansion card holder assembly 100 with metal cover 202 closed. FIG. 9 shows the standoff 400 of metal slide bracket 204 coupled to the standoff component 222 of the metal cover 202. To open the metal cover 202, a user can pull the tab 220 in direction 900. The metallic thickness of metal cover 202 should be such that elasticity is provided. In particularly, lock tabs 404-1 and 404-2 should deform and released from the lock tab openings 500-1 and 500-2.

Figure 10:
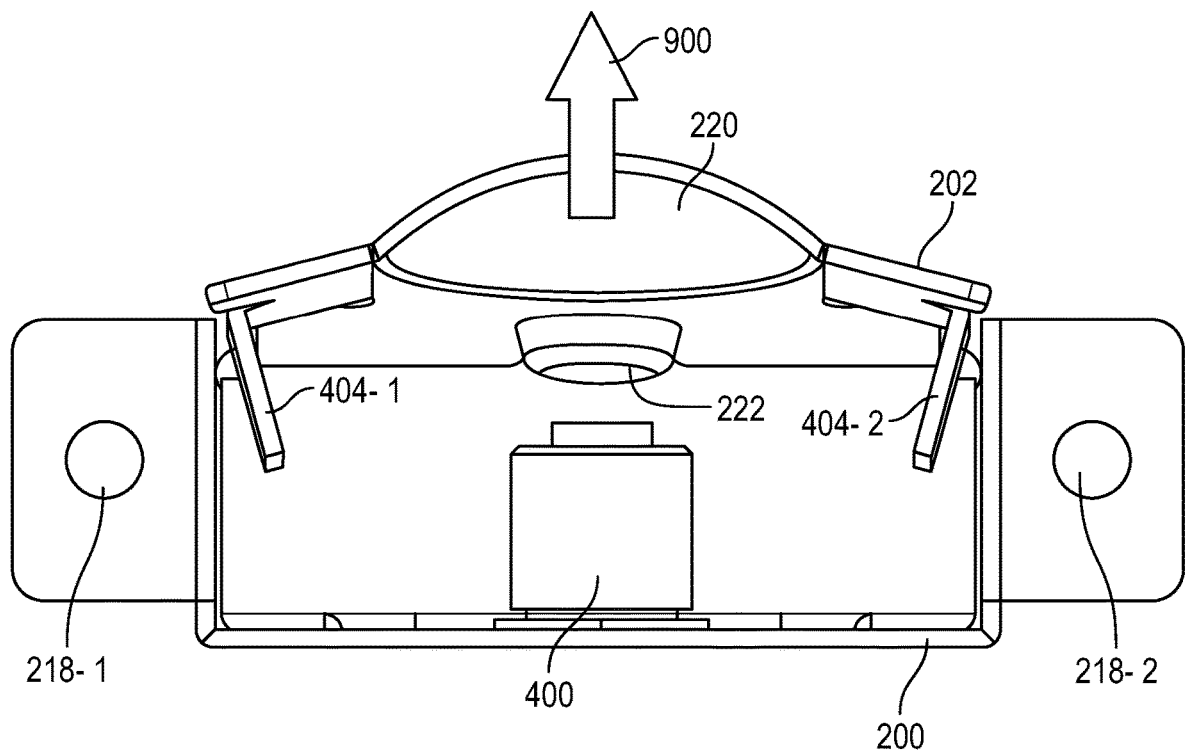
FIG. 10 depicts a bottom view of an open metal cover on a metal slide bracket.

FIG. 10 illustrates a bottom perspective view of expansion card holder assembly 100 with metal cover 202 opened. As tab 220 and metal cover 202 are pulled in direction 900, the lock tabs 404-1 and 404-2 are deformed and released from lock tab openings 500-1 and 500-2 of the metal slide bracket 204.

Figure 11:
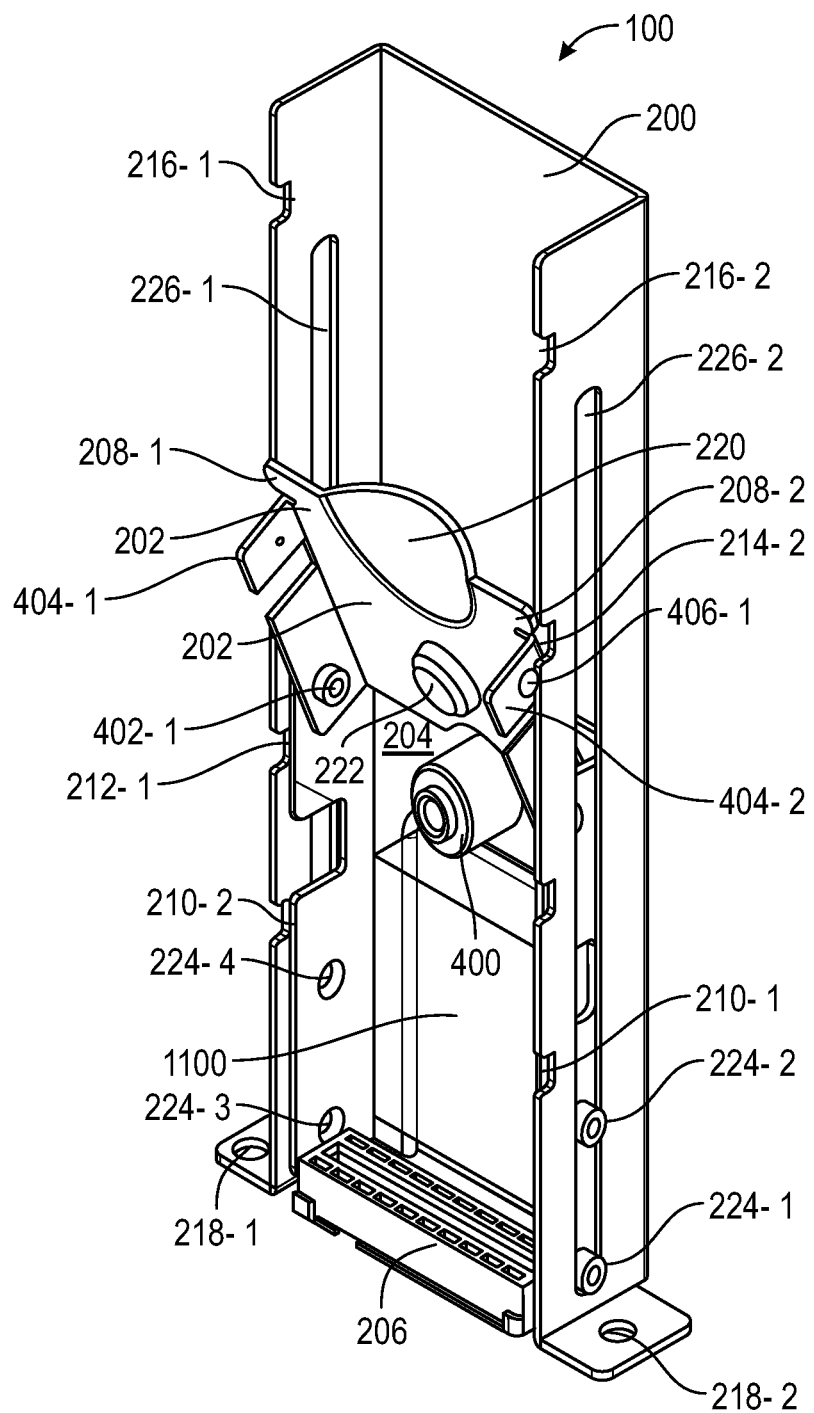
FIG. 11 depicts a top, front and right perspective view of a vertically mounted expansion card holder assembly with a thermal pad.

FIG. 11 illustrates a top, front and right perspective view of a vertically mounted expansion card holder assembly 100 with metal cover 202 opened, and a thermal pad 1100. Various implementations, where thermal grounding may be needed, provide for the thermal pad 1100 to be inserted between the expansion card 104 and the metal slide bracket 204. With standoff 400, the thermal pad 1100 can provide a thermal ground path for expansion card 104.

Figure 12:
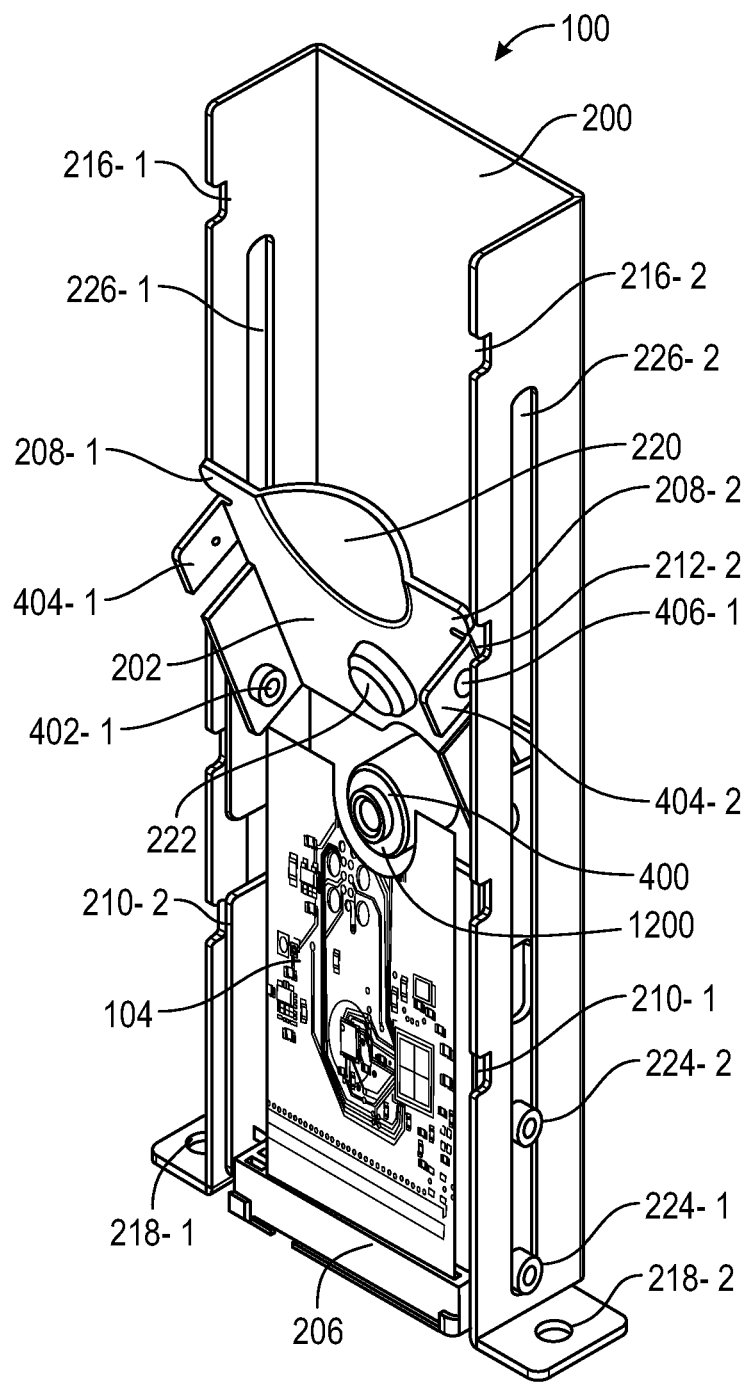
FIG. 12 depicts a top, front and right perspective view of a vertically mounted expansion card holder assembly with an expansion card.

FIG. 12 illustrates a top, front and right perspective view of a vertically mounted expansion card holder assembly 100 with metal cover 202 opened, and expansion card 104. A connection 1200 on the standoff 400 to expansion card 104 provides a ground path to the slide bracket 204 to the ground plane at screw holes 218-1 and 218-2. When metal cover 202 is closed, electro-magnetic compatibility (EMC) or electro-magnetic interference shielding is provided to prevent electron-magnetic interference or radio interference between the expansion card 104 and other internal components of the information handling system that includes the PCBA 102.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Consequently, the invention is intended to be limited only by the spirit and scope of the appended claims, giving full cognizance to equivalents in all respects.

What is claimed is:

1. An expansion card holder assembly comprising:
a metal base;
a metal slide bracket with roller type features that fit into grooves of the metal base wherein the metal slide bracket is configured to be positioned at different locations of the metal base;
a metal cover with openings that fit into insert pins of the metal slide bracket, and pivots to open and close; and
an expansion card connector that connects an expansion card to a printed circuit board of an information handling system.

2. The expansion card holder assembly of claim 1, wherein the metal base is mounted by metal screws to the printed circuit board.

3. The expansion card holder assembly of claim 2, wherein the metal slide bracket includes a standoff that connects with the expansion card, wherein an electrical ground is provided from the standoff, the metal slide bracket, metal base and the meal screws.

4. The expansion card holder assembly of claim 1, wherein the expansion card assembly is mounted vertically onto the printed circuit board.

5. The expansion card holder assembly of claim 1, wherein different positions of the metal slide bracket accommodate standardized expansion cards.

6. The expansion card holder assembly of claim 1, wherein when the metal cover is closed onto the metal slide bracket, an electro-magnetic shield is created.

7. The expansion card holder assembly of claim 1 further comprising a thermal pad between the metal base and the expansion card.

8. An information handing system including a printed circuit board, the information handling system comprising:
an expansion card holder assembly that comprises:
a metal base mounted by metal screws to the printed circuit board;
a metal slide bracket that includes roller type features that fit into grooves on either side of the metal base, wherein the metal slide bracket provides different positions for different size expansion cards; and
a metal cover that is pivotally connected to the metal slide bracket that opens to receive an expansion card.

9. The information handing system printed circuit board of claim 8, the expansion card holder assembly is mounted vertically on the printed circuit board.

10. The information handing system printed circuit board of claim 8, wherein the metal cover includes lock tabs the fit into insert openings of the metal slide bracket when the metal cover is closed.

11. The information handing system printed circuit board of claim 8, wherein the metal cover includes a tab to open and close the metal cover.

12. The information handing system printed circuit board of claim 8, wherein the metal slide bracket includes a standoff and the metal cover includes a standoff component that couples to the standoff when the cover is closed.

13. The information handing system printed circuit board of claim 12, wherein the standoff is configured to provide electrical and thermal grounding to the expansion card.

14. The information handing system printed circuit board of claim 8 further comprising a thermal pad placed between.

15. An assembly for different size computer expansion cards comprising:
a metal base that is mounted to a printed circuit board of an information handling system with metal grooves on either side;
a metal slide bracket having roller type features that fit into the grooves of the metal base, and the metal slide bracket configured to move along the metal base;
a metal cover configured to lock into the metal slide bracket when closed; and
a connection to receive an expansion card and connect the expansion card to the printed circuit board.

16. The assembly of claim 15, wherein the assembly is mounted vertically or horizontally onto the printed circuit board.

17. The assembly of claim 15, wherein the metal cover includes lock points that engage with the metal base to lock the metal cover in place when closed.

18. The assembly of claim 15, wherein electro-magnetic interference shielding is provided for radio transmitting expansion cards.

19. The assembly of claim 15, wherein thermal coupling is provided for expansion cards.

* * * * *